United States Patent [19]

Matsuoka et al.

[11] Patent Number: 5,683,262

[45] Date of Patent: Nov. 4, 1997

[54] IC SOCKET

[75] Inventors: Noriyuki Matsuoka, Yokohama; Kazumi Uratsuji, Tokyo, both of Japan

[73] Assignee: Yamaichi Electronics Co., Ltd., Tokyo, Japan

[21] Appl. No.: 738,494

[22] Filed: Oct. 28, 1996

Related U.S. Application Data

[63] Continuation of Ser. No. 490,995, Jun. 15, 1995, abandoned.

[30] Foreign Application Priority Data

Jun. 15, 1994 [JP] Japan ................................. 6-156767

[51] Int. Cl.⁶ ....................................... H01R 11/22
[52] U.S. Cl. ............................ 439/266; 439/330
[58] Field of Search .......................... 439/68–73, 264, 439/265, 266, 268, 269, 330, 331, 525, 526

[56] References Cited

U.S. PATENT DOCUMENTS

| | | | |
|---|---|---|---|
| 4,715,823 | 12/1987 | Ezura et al. | 439/267 |
| 5,009,609 | 4/1991 | Matsuoka et al. | 439/331 |
| 5,020,998 | 6/1991 | Ikeya et al. | 439/330 |
| 5,045,923 | 9/1991 | Matsuoka | 439/331 |
| 5,334,036 | 8/1994 | Matsuoka | 439/266 |
| 5,387,118 | 2/1995 | Kishi et al. | 439/266 |
| 5,451,816 | 9/1995 | Abe et al. | 257/701 |

*Primary Examiner*—Hien Vu
*Attorney, Agent, or Firm*—Wenderoth, Lind & Ponack

[57] ABSTRACT

In an IC socket, a depressing portion of a cover is pressed against a pressure receiving portion of a pressure receiving lever by downwardly pressing the cover, and then a contact portion of a contact is displaced in the rearward direction by movement of the pressure receiving lever. The depressing portion is formed by an inclined cam surface having a downward gradient in the rearward direction. When the cover is moved in the downward direction, the pressure receiving portion is caused to slidably move from the upper end side to the lower end side of the downwardly inclined cam surface.

20 Claims, 6 Drawing Sheets

/ 1
IC SOCKET

This application is a Continuation of now abandoned application, Ser. No. 08/490,995, filed on Jun. 15, 1995.

BACKGROUND OF THE INVENTION

1. Field of the Invention

The present invention relates to an IC socket adapted to release a contact from engagement with an IC package by displacing a contact portion of the contact in the rearward direction when a cover is actuated in the downward direction.

2. Description of the Prior Art

To facilitate understanding of the present invention, a conventional IC socket having the foregoing type disclosed in an official gazette of U.S. Pat. No. 5,009,609 will briefly be described below. As shown in FIG. 11 and FIG. 12, a cover 4 disposed to be displaced in the upward/downward direction on a socket body 1 is provided as means for displacing a contact in the rearward direction.

The cover 4 includes a downwardly projecting depressing portion 4a and an inclined cam surface 4a' having an upward gradient and extending rearward of a contact 3. When the cover 4 is actuated in the downward direction, the inclined cam surface 4a' serves to depress an end of a pressure receiving lever 6 extending rearward of the contact 3. As the end of the pressure receiving lever 6 is slidably displaced from the lower end side to the upper end side, a contact portion 3a of the contact 3 is displaced in the rearward direction.

Thus, the contact 3 is released from the contacted state relative to a lead 5a of an IC package 5 accommodated in an IC accommodating portion 2. At this time, the IC package 5 can be inserted in and removed from an IC socket.

When the actuating force of the cover 4 is released, the contact 3 is restored to an original state by its own resilient force. At this time, the cover 4 is raised up by a pressure receiving portion 6a adapted to slidably move from the upper end side to the lower end side so that the contact portion 3a is brought in pressure contact on the upper surface of the lead 5a.

Since the IC socket is constructed such that the contact portion 3a of the contact 3 is brought into pressure contact with the upper surface of the lead 5a, the lower surface of the lead to be soldered in practical use of the IC package will not be damaged. In addition, since a robot arm can be easily used for actuating the cover 4 and a group of contacts 3 can be displaced with a reduced magnitude of force in the rearward direction, the IC socket is often used as an IC package measuring socket or the like.

In spite of the aforementioned advantages, since the IC socket is constructed such that an inclined cam surface 4a' is formed to have an upward and rearward gradient, and a pressure receiving portion 6a slidably moves in such a manner as to escape in the direction opposite to the direction of lowering of the cover 4 as well as the direction of depressing of the pressure receiving portion 6a, it is obvious that a quantity of depressing of the pressure receiving portion 6a is reduced compared with a quantity of lowering of the contact opening/closing cover 4. Therefore, to assure that the contact portion 3a of the contact 3 is sufficiently displaced in the rearward direction to the position where it does not interfere with the IC package 5, it is necessary to lower cover 4 to such a degree as to compensate for the aforementioned quantity of reduction. This leads to a problem that the quantity of lowering of the cover 4 is increased.

When the quantity of lowering of the contact opening/closing cover 4 is increased in that way, there arises a problem that the IC socket must be constructed with an increased height. In addition, when a stroke of displacement of the cover 4 is elongated, there is a possibility that the cover 4 will be actuated less in the downward direction. Thus, there arises another problem that the quantity of displacement of the contact is hardly maintained.

SUMMARY OF THE INVENTION

The present invention has been made in consideration of the aforementioned problems.

An object of the present invention is to provide an IC socket which reduces the quantity of lowering of a cover necessary to adequately displace a contact, and moreover, to ensure that a contact portion of the contact can be displaced by a required distance in the rearward direction.

Another object of the present invention is to provide an IC socket which is dimensioned to have a reduced height.

To accomplish the above objects, the present invention provides an IC socket including a plurality of contacts arranged in parallel to a socket body to come in contact with leads of an IC package, a cover disposed on the socket body so as to be displaced in the upward and downward directions, and a pressure receiving lever associated with downward displacement of the contact to cause rearward displacement of the contact wherein when the cover is actuated in the downward direction, a certain intensity of depressing force is imparted to a pressure receiving portion with a depressing portion disposed on the cover to induce rearward displacement of the cover, wherein a depressing portion for the cover is formed by an inclined cam surface having a downward gradient in the rearward direction.

It is acceptable that the whole length or a part of the inclined cam surface is formed by a curved plane.

In addition, it is also acceptable that the whole length or a part of the inclined cam surface is formed by a straight plane.

Other objects, features and advantages of the present invention will readily become apparent from reading of the following description which has been made in conjunction with the accompanying drawings.

DESCRIPTION OF THE PREFERRED EMBODIMENTS

The present invention will now be described in detail hereinafter with reference to the accompanying drawings which illustrate preferred embodiments thereof.

Figure 6:
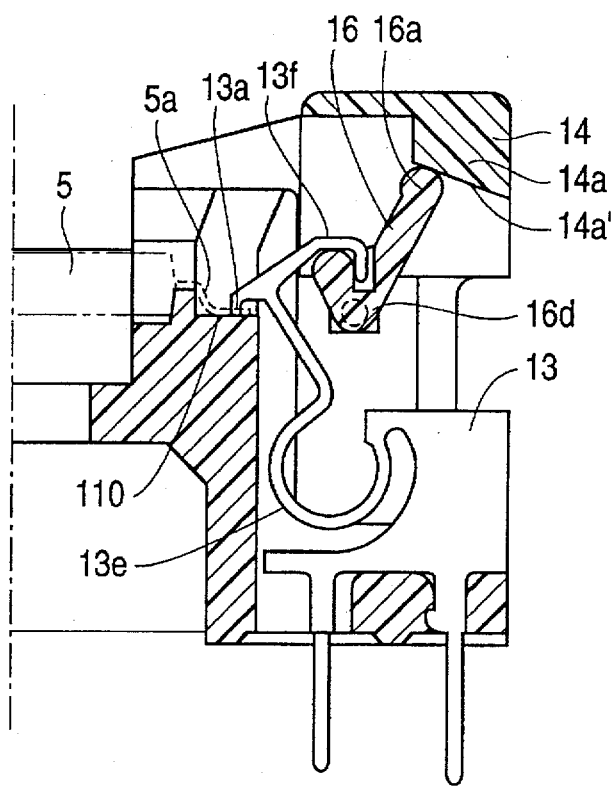
FIG. 6 is a fragmentary enlarged sectional view of an IC socket constructed in accordance with a second embodiment of the present invention, showing a state in which a contact portion of a contact is displaced in the forward direction.
Figure 7:
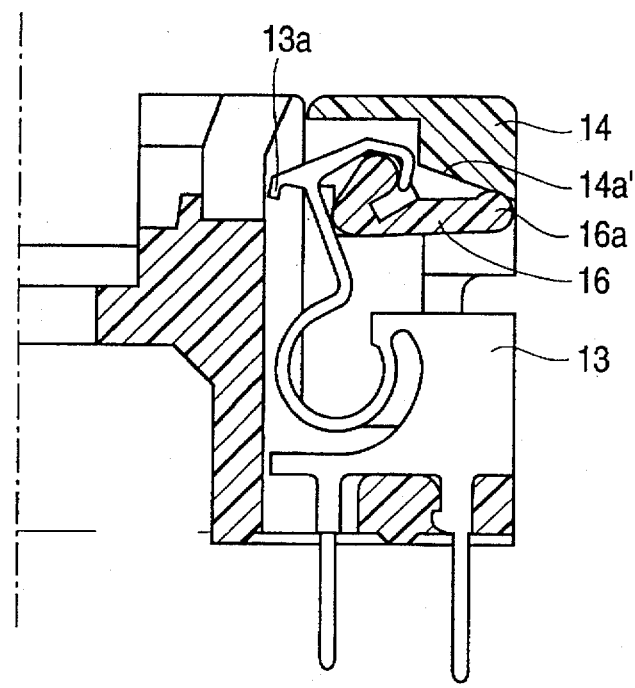
FIG. 7 is a fragmentary enlarged sectional view of the IC socket of FIG. 6, showing a state in which the contact portion of the contact is displaced in the rearward direction.
Figure 8:
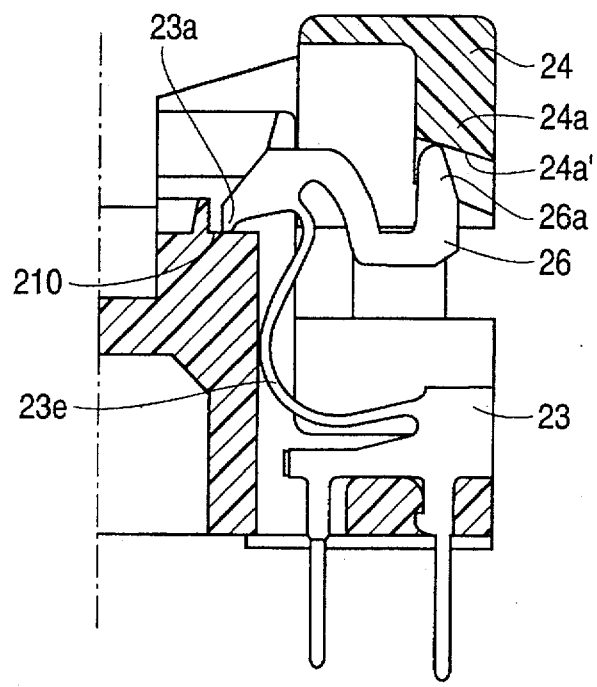
FIG. 8 is a fragmentary enlarged sectional view of an IC socket constructed in accordance with a third embodiment of the present invention, showing a state in which a contact portion of a contact is displaced in the forward direction.
Figure 9:
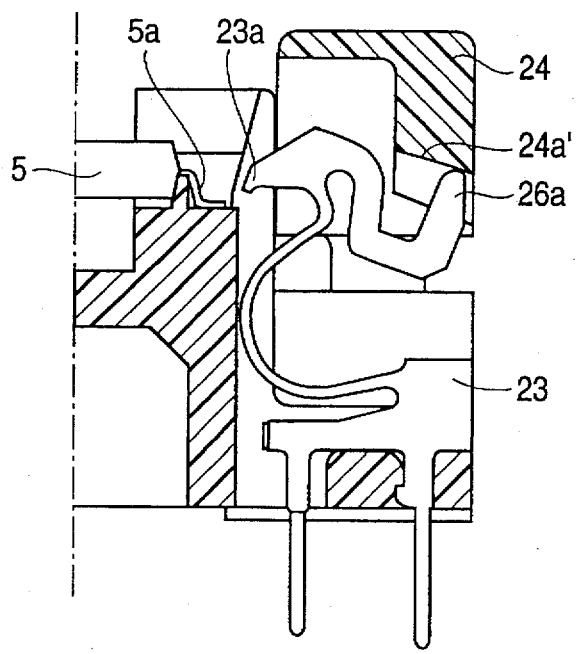
FIG. 9 is a fragmentary enlarged sectional view of an IC socket constructed in accordance with the third embodiment of the present invention, showing a state in which the contact portion of the contact is displaced in the rearward direction.
Figure 10:
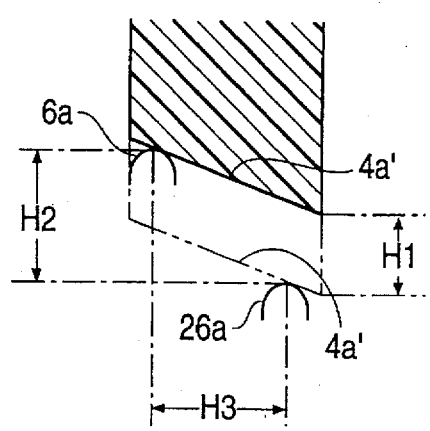
FIG. 10 is an enlarged sectional view which schematically explains the operative state of the pressure receiving portion in each of the first to the third embodiments.
Figure 11:
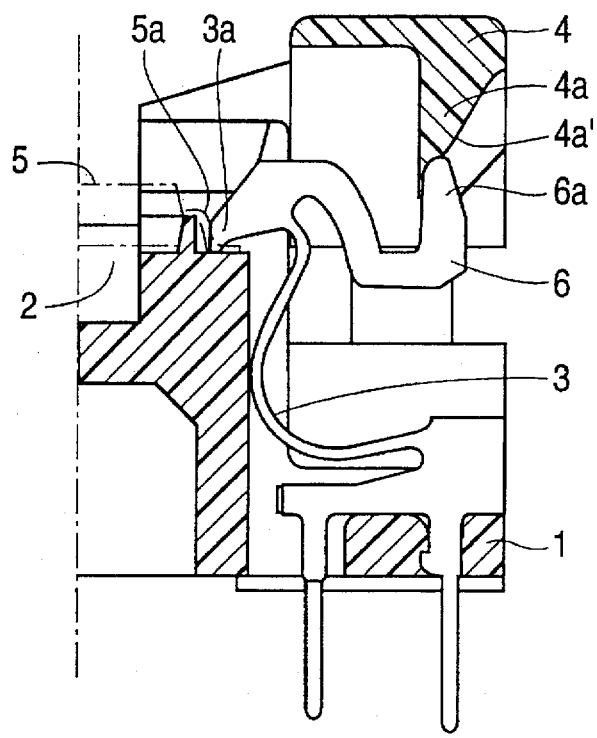
FIG. 11 is a fragmentary sectional view of a conventional IC socket, showing a state in which a contact portion of a contact is displaced in the forward direction.
Figure 12:
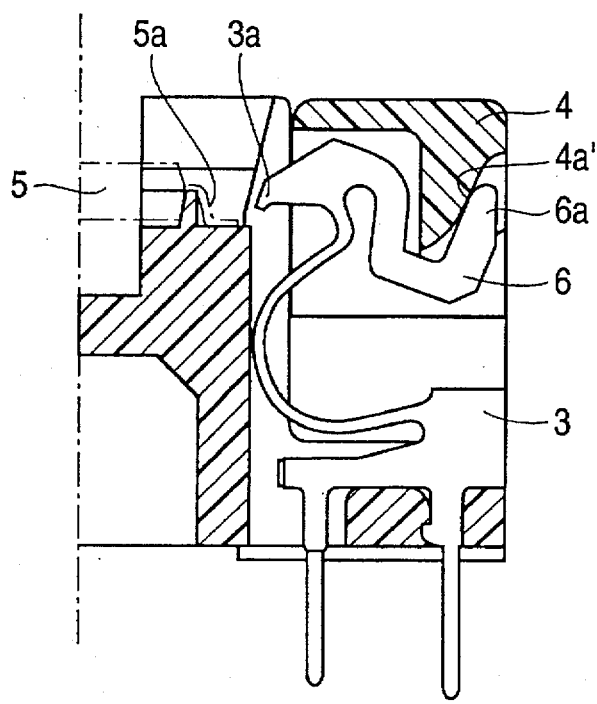
FIG. 12 is a fragmentary enlarged sectional view of the conventional IC socket, showing a state in which the contact portion of the contact is displaced in the rearward direction.

FIG. 1 to FIG. 5 show an IC socket constructed in accordance with a first embodiment of the present invention, FIG. 6 and FIG. 7 show an IC socket constructed in accordance with a second embodiment of the present invention, FIG. 8 and FIG. 9 show an IC socket constructed in accordance with a hird embodiment of the present invention, and FIG. 10 is a view which shows the operational state of a pressure receiving portion in cooperation with a downward inclined cam surface in each of the first to third embodiments of the present invention.

Figure 3:
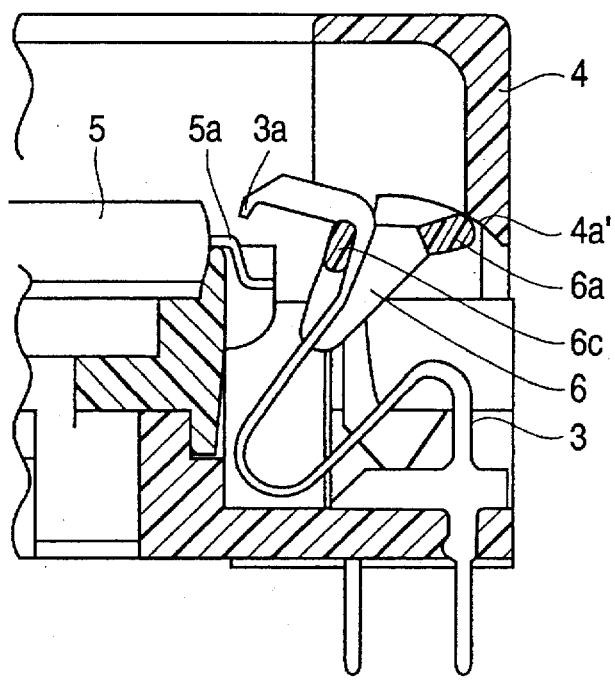
FIG. 3 is a fragmentary enlarged sectional view of the IC socket, showing a state in which the foregoing contact portion is being displaced in the rearward direction.

In each embodiment, a socket body 1 molded of insulative synthetic resin includes a substantially rectangular IC accommodating portion 2 at its central part which is kept open in the upward direction so as to accommodate an IC package 5. A plurality of contacts 3 (merely a single contact is shown in most of the drawing figures for the convenience of illustration) are arranged in parallel to each other along two opposing sides or four sides of the IC accommodating portion 2 corresponding to a plurality of leads 5a of the IC package 2, and a cover 4 for imparting a force to displace the contacts 3 to a position in which they do not come in contact with the IC lead 5a during removal or insertion of the IC package (FIG. 4), or to a position in which the contacts are released from the contacted state with the IC leads 5a (FIG. 3).

The cover 4 includes a window 4b corresponding to the IC accommodating portion 2 so that IC packages 5 can be fitted in the IC accommodating portion 2 through the window 4b.

Figure 1:
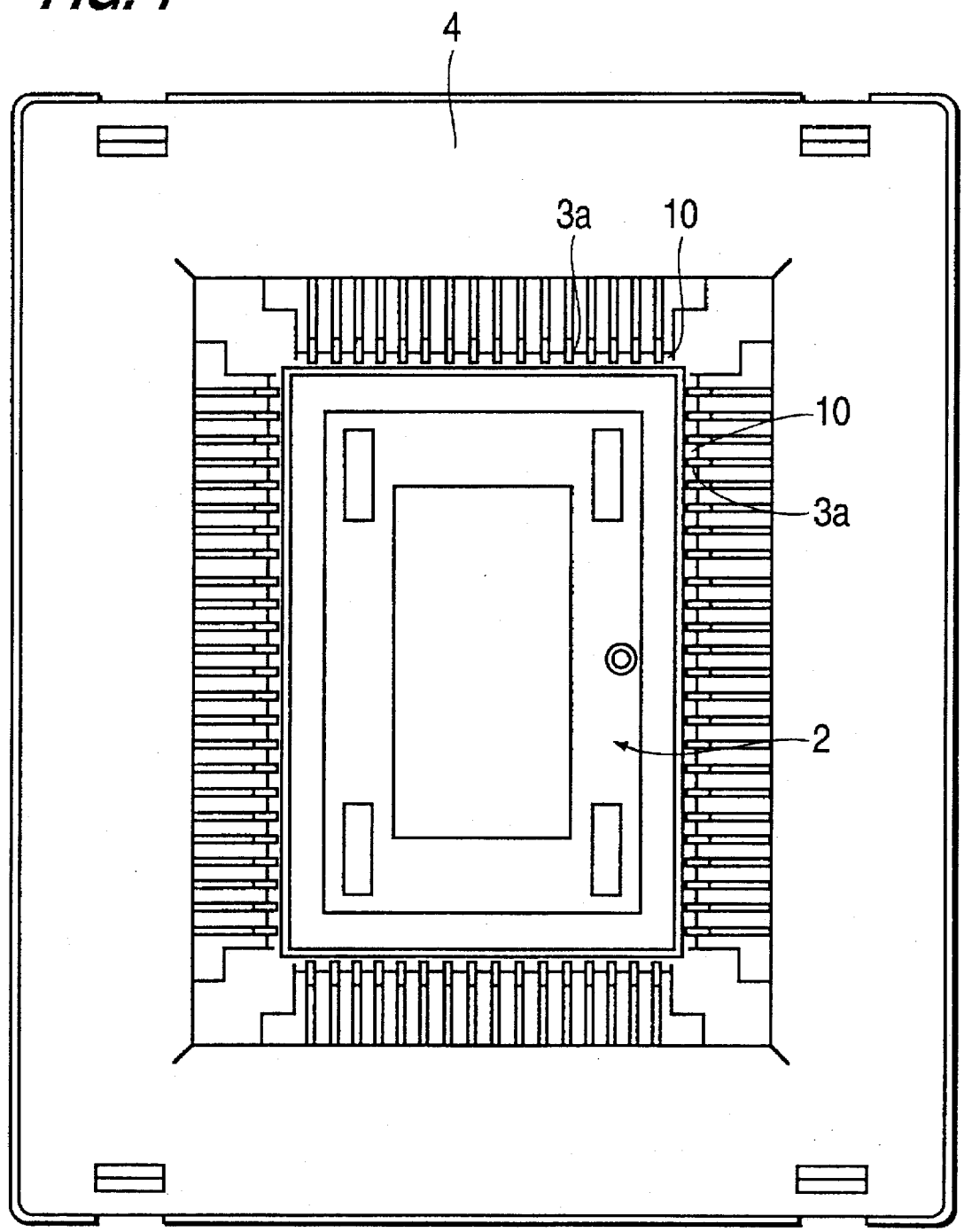
FIG. 1 is a plan view of an IC socket constructed in accordance with a first embodiment of the present invention.
Figure 2:
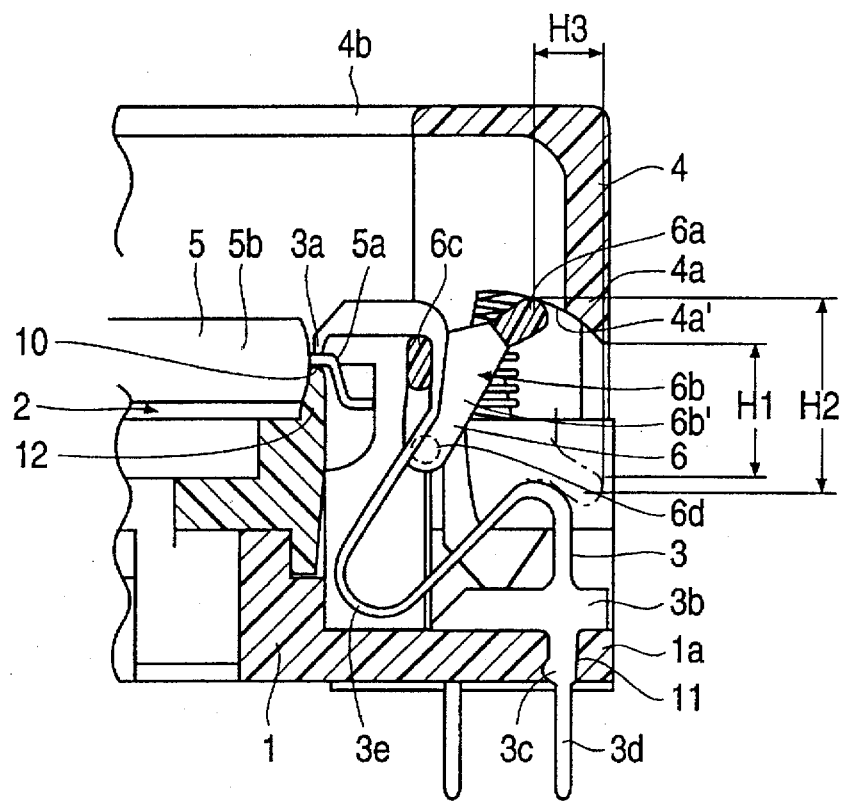
FIG. 2 is a fragmentary enlarged sectional view of the IC socket, showing a state in which a contact portion of a contact is displaced in the forward direction.

The IC accommodating portion 2 includes a rib 12 which extends in parallel to a row of contacts 3 and is located inwardly of the row of contacts 3. As shown in FIG. 2 and others, the rib 12 restrictively defines the position of the side surface of an IC package body 5b from which leads 5a protrude. The lower surfaces of the base ends of crab foot-like leads 5a bent with two steps are placed on the upper surface of the rib 12, whereby an IC package body 5b is supported with its bottom surface spaced above the bottom surface of the IC accommodating portion 2.

Each contact 3 includes a support plate portion 3b supported on an upper surface of a contact receiving portion 1a of the socket body 1, and a press fitting portion 3c projecting downward of the support plate portion 3b. The press fitting portion 3c is press-fitted into a contact press-fitting hole 11 so as to allow the contact 3 to stand upright. Further, a terminal portion 3d is projected downward of the press fitting portion 3c.

In addition, each contact 3 includes a curved spring portion 3e which extends from the upper part of the support plate portion 3b in a forward (i.e. inward) direction ( i.e., toward the IC accommodating portion 2), and moreover, it includes contact portion 3a which projects slantwise forwardly (i.e. inwardly) toward a lead support surface 10.

In the drawings, reference numeral 6 denotes a pressure receiving lever which causes the contact portion 3a of the contact 3 to be displaced in the rearward (i.e. outward direction upon downward displacement of the cover 4. Referring to FIG. 1 to FIG. 5, the pressure receiving lever 6 is prepared separately from the contact 3 and is molded of an insulative synthetic resin.

Each of the pressure receiving levers 6 extends in parallel with its respective row of contacts and includes a number of through slits 6b through which a number of contacts 3 are respectively inserted. The contact portion 3a of each of the the contacts 3 is projected outwardly from its respective through slit 6b (FIGS. 2 and 3).

Each through slit 6b opens in both the downward direction and the upward direction, and the side-to-side position of the contact 3 inserted through each the slit 6b is restrictively defined by the separated walls 6b' forming the slits 6b. The pressure receiving lever 6 also includes an abutment portion 6c which engages the contacts 3, and causes displacement of the contacts 3 in the forward or rearward direction as the lever 6 is turned.

Namely, the upper end of the curved spring portion 3e of each contact 3 is inserted through the respective through slit 6a formed between the separated walls 6b', a contact portion 3a is projected forward of the upper opening of the through slit 6b, and an inverted L-shaped portion of the contact portion 3a located at the head portion of the latter resiliently rests on the lead 5a.

Each of the pressure receiving levers 6 includes shaft portions 6d on the opposite side thereof, and the separated walls 6b' and slits 6b are arranged in parallel to each other in the direction perpendicular to the axis line of the shaft portions 6d. Thus, the pressure receiving lever 6 is rotatably supported on the socket body 1 with the aid of the shaft portions 6d which are located below the cover 4.

Each of the pressure receiving levers 6 includes a pressure receiving portion 6a by way of which the separated walls 6b' are connected to each other in the spaced relationship. The pressure receiving portion 6a faces a depressing portion 4a of the cover 4, such that the depressing portion 4a is supported by the pressure receiving portion 6a. Thus, the cover 4 is supported by the pressure receiving levers 6.

As shown in FIG. 2, an inclined cam surface 4a' is formed corresponding to the depressing surface of the depressing portion 4a and is inclined downwardly and rearwardly of the contact portion 3.

A part or the whole downward inclined cam surface 4a' is composed of a curved plane. Otherwise, as shown in FIG. 1 to FIG. 4, the whole length of the downward inclined cam surface 4a' is composed of a curved plane. For example, the starting side (upper end side) of the curved plane may extend linearly with a small gradient and the tail end side (lower end side) of the same may extend linearly with a large gradient. For example, the curved plane portion having the small gradient may be a straight plane.

While the downwardly inclined cam surface 4a' faces the pressure receiving portion 6a of the pressure receiving lever 6, the cover 4 is supported by the pressure receiving portion 6a.

The cover 4 and the pressure receiving lever 6 are operatively associated with each other while they are brought in contact with each other.

As shown in FIG. 2, the contact portion 3a of the contact 3 is normally biased in the forward direction by the resilient force of the spring portion 3e. When the IC package 5 is accommodated in the accommodating portion 2, the contact portion 3a comes in pressure contact with the upper surface of the IC lead 5a, but when no IC package 5 is present, the contact portion 3a comes in pressure contact with a lead supporting surface 10. The pressure receiving lever 6 is turned in the upward direction by allowing the spring portion 3e of the contact 2 to thrust against the abutment portion 6c, causing the cover 4 placed on the pressure receiving portion 6a to be raised up until the pressure receiving portion 6a comes in contact with the upper end portion of the downwardly inclined cam surface 4a'.

When the cover 4 is lowered from the upper end waiting position as shown in FIG. 2, the pressure receiving portion 6a is slidably lowered by the downwardly inclined cam surface 4a', while the lever 6 is downwardly turned about the shafts 6d, as shown in FIG. 3. At this time, the abutment portion 6c trails the upper end of the spring portion 3e. As a result, the contact portion 3a starts to be slantwise upwardly displaced in the rearward direction against the spring portion 3e, causing the contact portion 3a to be released from contact with the IC lead 5a.

Figure 4:
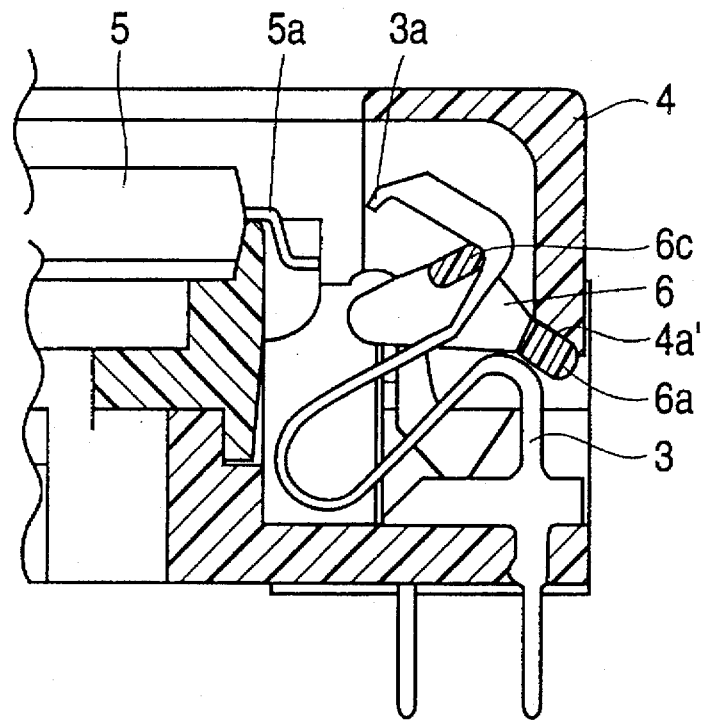
FIG. 4 is a fragmentary enlarged sectional view of the IC socket, showing a state in which the rearward displacement of the contact portion of the contact has been completed.
Figure 5:
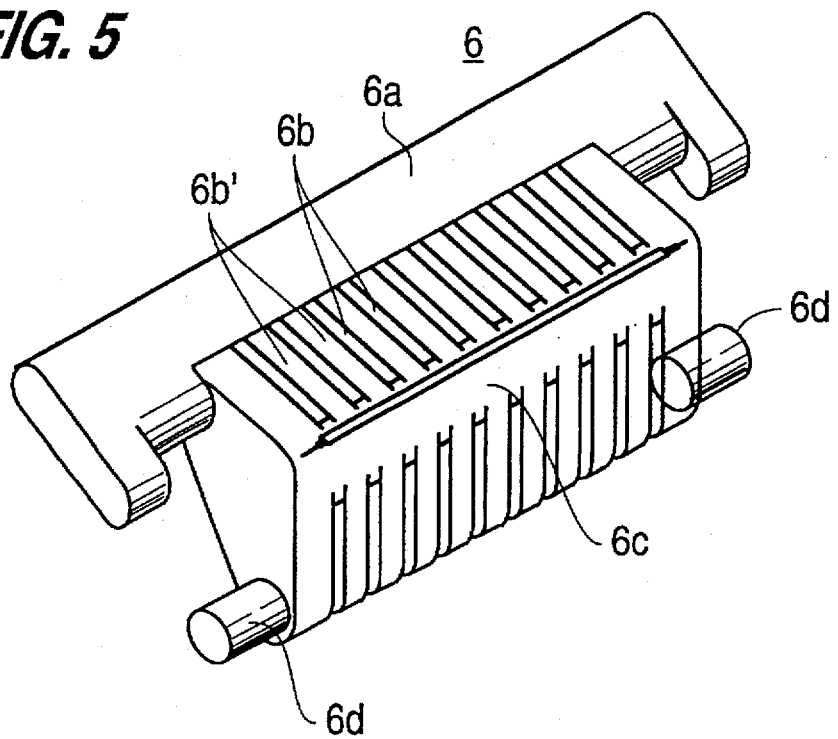
FIG. 5 is a perspective view of a pressure receiving lever used for the IC socket.

When the cover 4 continues to be lowered, causing the pressure receiving lever 6 to be further turned in the downward direction, the pressure receiving portion 6a is slidably displaced to the lower end side (tail end side) of the downwardly inclined cam surface 4a' so that the contact portion 3a is displaced in the rearward direction while turning the pressure receiving lever 6 further in the downward direction as shown in FIG. 4.

Consequently, while the contact portion 3a of the contact 3 is retracted outside of the range defined by the IC accommodating portion 2, the IC package 5 can be removed from or inserted into the IC accommodating portion 2.

Next, the cover 4 is released from the lowering movement, and the associated components are displaced in the reverse direction from the state shown in FIG. 4 to the state shown in FIG. 2. Specifically, a depressing force is applied to the abutment portion 6c by the restorable force of the spring portion 3e of the contact 3, and the pressure receiving lever 6 is turned in the upward direction, causing the contact portion 3a of the contact 3 to be slantwise downwardly displaced in the forward direction. In this manner, the contact portion 3a is brought into pressure contact with the upper surface of the IC lead 5a. At this time, the pressure receiving portion 6a is slidably displaced along the surface of the downwardly inclined cam surface 4a' from the lower end side to the upper end side thereof, and the cover 4 is raised.

In the embodiment as mentioned above, the total quantity of lowering of the cover is transmitted to the pressure receiving portion 6a, and moreover, the height difference between the upper end side of the downward inclined cam surface 4a' and the lower end side of the same is added to the foregoing quantity of lowering, resulting in the pressure receiving portion 6a being correspondingly thrusted. Therefore, the required quantity of lowering of the cover 4 can be minimized.

According to the second embodiment of the present invention as shown in FIG. 6 and FIG. 7, a pressure receiving lever 16 molded of an insulative synthetic resin is prepared separately from a contact 13, and is turnably supported by a shaft 16d located behind the contact 13. On the other hand, a hook 13f is projected from an upper end portion of the contact 13 to the rear side so that the hook 13f is held in an engaged state in the vicinity of the pressure receiving lever 16. A pressure receiving portion 16a is formed at the rear end of the pressure receiving lever 16, and the pressure receiving portion 16a is brought into contact with a downwardly inclined cam surface 14a' of a depressing portion 14a of a cover 14, the cam surface 14a' being formed in opposing relationship to the pressure receiving portion 16a. Further, the pressure receiving portion 16a supports the cover 14.

In the second embodiment, the downwardly inclined cam surface 14a' is formed with a straight surface.

As shown in FIG. 6, when a contact portion 13a of the contact 13 is displaced in the forward direction in conformity with the resilient force of a spring portion 13e to move into pressure contact with a lead support surface 110 or into pressure contact with an upper surface of an IC lead 5a, the hook 13f imparts a tensile force to the fore end of the pressure receiving lever 16, causing the pressure receiving portion 16a formed at the other end of the pressure receiving lever 16 to be turned in the upward direction with the shaft 16d as a center.

As a result, the pressure receiving portion 16a raises the inclined cam surface 14a', and moreover, raises the cover 14.

From the operative state as shown in FIG. 6, as the cover 14 is lowered from an upper limit waiting position, the pressure receiving portion 16a is lowered by the downwardly inclined cam surface 14a', causing the pressure receiving portion 16a to be slidably displaced from the upper end side to the lower end side. Subsequently, the pressure receiving lever 16 is turned with the shaft 16d as a center so that the hook 13f is trailed by the pressure receiving lever 16. Consequently, the contact portion 13a is slantwise upwardly displaced in the rearward direction against the resilient force of the spring portion 13e, whereby the contact portion 13a is released from the contact state with the IC lead 5a.

While the contact portion 13a of the contact 13 is retracted outside of the range defined by an IC accommodating portion 2, an IC package 5 can be removed from or inserted into the IC accommodating portion 2.

Next, when the cover 14 is released from the lowered state, the associated components are displaced in reverse from the state shown in FIG. 7 to the state shown in FIG. 6. Specifically, a certain intensity of tensile force is imparted to the fore end of the lever 16 by the restorative force of the spring portion 13e of the contact 13, and the pressure receiving lever 16 is turned in the upward direction. As the pressure receiving lever 16 is turned in the upward direction, the contact portion 13a of the contact 13 is slantwise downwardly displaced in the forward direction by the restoring force of the spring portion 13e of the contact 13, resulting in the contact portion 13a being brought into contact with the upper surface of the IC lead 5a. At this time, the pressure receiving portion 16a is slidably displaced from the lower end side to the upper end side of the downwardly inclined cam 14a', causing the cover 14 to be raised.

In the second embodiment as described above, the whole quantity of lowering of the cover 14 is transmitted to the pressure receiving portion 16a, and the height difference between the upper end side of the downwardly inclined cam 14a' and the lower end side of the same is added to the foregoing quantity of lowering, resulting in the pressure receiving portion 16a being correspondingly depressed. Therefore, a quantity of lowering of the cover 14 can be minimized in the same manner as the first embodiment.

In each of the first and second embodiments described above the pressure receiving lever 6 (or 16) and the contact 3 (or 13) are prepared as separate components. FIG. 8 and FIG. 9 show a third embodiment wherein a pressure receiving lever 26 and a contact 23 are integrally punched out.

The contact 23 includes a cantilever extending in the rearward direction from a position located in the vicinity of the upper end, i.e, at a location at which the spring portion 23e and the contact portion 23a join, and the pressure receiving lever 26 is formed by the foregoing cantilever.

The pressure receiving lever 26 includes a pressure receiving portion 26a which stands upright at a rear end thereof. This pressure receiving portion 26 comes in contact with a downwardly inclined cam surface 24a' of a depressing portion 24a of a cover 24, the cam surface 24a' being in an opposing relationship with the pressure receiving portion 26a, and the cover 24 is supported by the pressure receiving portion 26a.

In this third embodiment, the downwardly inclined cam 24a' may be formed by a straight plane in the same manner as the second embodiment, or it may be formed by a curved plane in the same manner as the first embodiment, or it may be formed by a combination of a straight plane (i.e. a planar surface) and a curved plane (i.e. a curved surface).

As shown in FIG. 8, a contact portion 23a of the contact 23 is displaced in the forward direction by the resilient force of the spring portion 23e of the contact 23 and comes in pressure contact with the upper surface of the IC lead 5a. However, when the contact portion 23a comes in pressure contact with the upper surface of the IC lead 5a, the pressure receiving lever 26 is turned in the upward direction.

As a result, the pressure receiving portion 26a moves upwardly along a downwardly inclined cam surface 24a' and raises the cover 24.

When the cover 24 is lowered from the upper limit waiting position from the operative state shown in FIG. 8, the pressure receiving portion 26a is pushed down by the downwardly inclined cam 24a' as shown in FIG. 9. Thus, the pressure receiving lever 26 is downwardly turned while the pressure receiving portion 26a is slidably displaced from the upper end side to the lower end side of the cam surface 24a'. Consequently, the contact portion 23a is slantwise upwardly displaced in the rearward direction against the resilient force of the spring portion 23e whereby it is released from contact with the IC lead 5a.

Thus, while the contact portion 23a of the contact 23 is located outside of the range of the IC accommodating portion 2, the IC package 5 is removed from or inserted into the IC accommodating portion 2.

Next, when the lowering force imparted to the cover 24 is released, the associated components are displaced in reverse from the state shown in FIG. 9 to the state shown in FIG. 8. Specifically, the pressure receiving lever 26 is upwardly turned by the restoring force of the spring portion 23e of the contact 23, and as the lever 26 is upwardly turned, the contact portion 23a of the contact 23 is slantwise downwardly displaced in the forward direction by the restoring force of the spring portion 23e, causing the contact portion 23a to be moved into pressure contact with the upper surface of the IC lead 5a. At this time, the pressure receiving portion 26a is slidably displaced along the downwardly inclined cam surface 24a' from the lower end side to the upper end side thereof so as to allow the cover 24 to be raised.

According to the third embodiment as described above, the whole quantity of lowering of the cover 24 is transmitted to the pressure receiving portion 26a, and the difference in height between the upper end side and the lower end side of the downwardly inclined cam surface 24a' is added to the quantity of lowering of the cover 24. Therefore, the quantity of lowering of the cover 24 can be minimized in the same manner as in each of the first embodiment and the second embodiment of the present invention.

FIG. 10 shows the relationship between the quantity H2 of lowering of the pressure receiving portion 6a (or 16a or 26a) and the quantity H3 of displacement of the same in the rearward direction relative to the quantity H1 of lowering of the cover 4 (or 14 or 24) in each of the first to third embodiments of the present invention.

As is apparent from FIG. 10, the quantity H2 of lowering of the pressure receiving member 6a can be increased relative to the quantity H1 of lowering of the cover 4 (i.e. the distance H2 is greater than the distance H1), and moreover, a quantity H3 of displacement of the pressure receiving portion 6a can be sufficiently maintained.

This fact is directly reflected in the quantity of displacement of the contact portion 3a of the contact 3 in the rearward direction.

As is apparent from the above description, a large quantity of displacement of the contact portion 3a in the rearward direction can be obtained with a small quantity of lowering of the cover 4 (i.e. the distance H3 is greater than the distance H1).

While the present invention has been described above with respect to a few preferred embodiments thereof, it should of course be understood that the present invention should not be limited only to these embodiments but that various changes or modifications may be made without departure from the scope of the present invention as defined by the appended claims.

What is claimed is:

1. An IC socket for receiving an IC package having IC leads, said IC socket comprising:

a socket body having an IC receiving portion at a central portion thereof;

at least one row of parallel contacts mounted to said socket body outwardly of said IC receiving portion, each of said contacts having an IC lead contacting portion movable between an IC lead contacting position and an IC lead releasing position located outwardly of said IC lead contacting position;

at least one pressure receiving lever respectively coupled with said contacts of said at least one row of parallel contacts, said at least one pressure receiving lever having a pressure receiving portion and being shiftable between an inward position and an outward position;

a cover movably mounted on said socket body for movement between an upper position and a lower position, said cover including at least one downwardly extending sidewall having an inclined cam surface disposed outwardly of said IC receiving portion of said socket body and being respectively engageable with said at least one pressure receiving portion of said at least one pressure receiving lever for shifting said at least one pressure receiving lever toward said outward position upon movement of said cover toward said lower position to cause said contacts of said at least one row of parallel contacts to move toward said IC lead releasing positions;

wherein said at least one inclined cam surface of said cover is inclined downwardly in a direction outwardly from said IC receiving portion of said socket body; and wherein said at least one inclined cam surface of said cover is curved, and inclined downwardly, over an entire length thereof from an innermost edge thereof to an outermost edge thereof, to thereby reduce a quantity of lowering of said cover necessary to adequately displace said contacts.

2. An IC socket as recited in claim 1, wherein said at least one inclined cam surface constitutes a means for moving said at least one pressure receiving portion of said at least one pressure receiving lever downwardly by a first distance upon downward movement of said cover by a second distance smaller than said first distance.

3. An IC socket as recited in claim 2, wherein said at least one inclined cam surface further constitutes a means for moving said at least one pressure receiving portion of said at least one pressure receiving lever outwardly by a third distance upon downward movement of said cover by said second distance, and said second distance is smaller than said third distance.

4. An IC socket as recited in claim 1, wherein said at least one inclined cam surface constitutes a means for moving said at least one pressure receiving portion of said at least one pressure receiving lever outwardly by a first distance upon downward movement of said cover by a second distance smaller than said first distance.

5. An IC socket as recited in claim 1, wherein said at least one inclined cam surface of said cover has an inner portion inclined at a first gradient, and an outer portion inclined at a second gradient larger than said first gradient.

6. An IC socket as recited in claim 1, wherein said at least one pressure receiving lever and said contacts are separate and discrete members.

7. An IC socket as recited in claim 1, wherein said at least one pressure receiving lever comprises a plurality of pressure receiving levers which are integrally formed with said contacts, respectively.

8. An IC socket for receiving an IC package having IC leads, said IC socket comprising:

a socket body having an IC receiving portion at a central portion thereof;

at least one row of parallel contacts mounted to said socket body outwardly of said IC receiving portion, each of said contacts having an IC lead contacting portion movable between an IC lead contacting position and an IC lead releasing position located outwardly of said IC lead contacting position;

at least one pressure receiving lever respectively coupled with said contacts of said at least one row of parallel contacts, said at least one pressure receiving lever having a pressure receiving portion and being shiftable between an inward position and an outward position;

a cover movably mounted on said socket body for movement between an upper position and a lower position, said cover including at least one downwardly extending sidewall having an inclined cam surface disposed outwardly of said IC receiving portion of said socket body and being respectively engageable with said at least one pressure receiving portion of said at least one pressure receiving lever for shifting said at least one pressure receiving lever toward said outward position upon movement of said cover toward said lower position to cause said contacts of said at least one row of parallel contacts to move toward said IC lead releasing positions; and wherein said at least one inclined cam surface of said cover is inclined downwardly in a direction outwardly from said IC receiving portion of said socket body; and wherein said at least one inclined cam surface of said cover is planar over an entire length thereof from an innermost edge thereof to an outermost edge thereof, to thereby reduce a quantity of lowering of said cover necessary to adequately displace said contacts.

9. An IC socket as recited in claim 8, wherein said at least one inclined cam surface further constitutes a means for moving said at least one pressure receiving portion of said at least one pressure receiving lever outwardly by a third distance upon downward movement of said cover by said second distance, and said second distance is smaller than said third distance.

10. An IC socket as recited in claim 8, wherein said at least one pressure receiving lever and said contacts are separate and discrete members.

11. An IC socket as recited in claim 8, wherein said at least one pressure receiving lever comprises a plurality of pressure receiving levers which are integrally formed with said contacts, respectively.

12. An IC socket as recited in claim 8, wherein said at least one inclined cam surface constitutes a means for moving said at least one pressure receiving portion of said at least one pressure receiving lever downwardly by a first distance upon downward movement of said cover by a second distance smaller than said first distance.

13. An IC socket as recited in claim 12, wherein said at least one inclined cam surface further constitutes a means for moving said at least one pressure receiving portion of said at least one pressure receiving lever outwardly by a third distance upon downward movement of said cover by said second distance, and said second distance is smaller than said third distance.

14. An IC socket as recited in claim 8, wherein said at least one inclined cam surface constitutes a means for moving said at least one pressure receiving portion of said at least one pressure receiving lever outwardly by a first distance upon downward movement of said cover by a second distance smaller than said first distance.

15. An IC socket for receiving an IC package having IC leads, said IC socket comprising:

a socket body having an IC receiving portion at a central portion thereof;

at least one row of parallel contacts mounted to said socket body outwardly of said IC receiving portion, each of said contacts having an IC lead contacting portion movable between an IC lead contacting position and an IC lead releasing position located outwardly of said IC lead contacting position;

at least one pressure receiving lever respectively coupled with said contacts of said at least one row of parallel contacts, said at least one pressure receiving lever having a pressure receiving portion and being shiftable between an inward position and an outward position;

a cover movably mounted on said socket body for movement between an upper position and a lower position, said cover including at least one downwardly extending sidewall having an inclined cam surface disposed outwardly of said IC receiving portion of said socket body and being respectively engageable with said at least one pressure receiving portion of said at least one pressure receiving lever for shifting said at least one pressure receiving lever toward said outward position upon movement or said cover toward said lower position to cause said contacts of said at least one row of parallel contacts to move toward said IC lead releasing positions; and wherein said at least one inclined cam surface of said cover is inclined downwardly in a direction outwardly from said IC receiving portion of said socket body; and wherein said at least one inclined cam surface of said cover includes an inner portion which is planar and inclined downwardly in the direction outwardly from said IC receiving portion of said socket body, and an outer portion which is curved and inclined downwardly in the direction outwardly from said IC receiving portion, to thereby reduce a quantity of lowering of said cover necessary to adequately displace said contacts.

16. An IC socket as recited in claim 15, wherein said inner portion of said at least one inclined cam surface is inclined at a first gradient, and said outer portion of said at least one inclined cam surface is inclined at a second gradient larger than said first gradient.

17. An IC socket as recited in claim 15, wherein said at least one pressure receiving lever and said contacts are separate and discrete members.

18. An IC socket as recited in claim 15, wherein said at least one pressure receiving lever comprises a plurality of pressure receiving levers which are integrally formed with said contacts, respectively.

19. An IC socket as recited in claim 15, wherein said at least one inclined cam surface constitutes a means for moving said at least one pressure receiving portion of said at least one pressure receiving lever downwardly by a first distance upon downward movement of said cover by a second distance smaller than said first distance.

20. An IC socket as recited in claim 15, wherein said at least one inclined cam surface constitutes a means for moving said at least one pressure receiving portion of said at least one pressure receiving lever outwardly by a first distance upon downward movement of said cover by a second distance smaller than said first distance.

* * * * *